(12) United States Patent
Barnak et al.

(10) Patent No.: US 6,849,509 B2
(45) Date of Patent: Feb. 1, 2005

(54) METHODS OF FORMING A MULTILAYER STACK ALLOY FOR WORK FUNCTION ENGINEERING

(75) Inventors: John Barnak, Beaverton, OR (US);
Collin Borla, Sherwood, OR (US);
Mark Doczy, Beaverton, OR (US);
Markus Kuhn, Hillsboro, OR (US);
Jacob M. Jensen, Springfield, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/315,646

(22) Filed: Dec. 9, 2002

(65) Prior Publication Data

US 2004/0108557 A1 Jun. 10, 2004

(51) Int. Cl.⁷ .......................................... H01L 21/8234
(52) U.S. Cl. ...................................... 438/275; 438/592
(58) Field of Search ................................. 438/275, 592, 438/655, 656, 658, 660

(56) References Cited

U.S. PATENT DOCUMENTS

| 5,757,032 | A | * | 5/1998 | Nishibayashi et al. ......... 257/77 |
| 6,130,123 | A | * | 10/2000 | Liang et al. ................. 438/217 |
| 2003/0180994 | A1 | * | 9/2003 | Polishchuk et al. ......... 438/275 |

* cited by examiner

Primary Examiner—Chandra Chaudhari
(74) Attorney, Agent, or Firm—Blakely, Sokoloff, Taylor & Zafman LLP

(57) ABSTRACT

A method of forming a gate electrode is described, comprising forming a dielectric layer on a substrate, forming a first metal layer having a first work function on the dielectric layer, forming a second metal layer having a second work function on the first metal layer, such that a gate electrode is formed on the dielectric layer which has a work function that is determined from the work function of the alloy of the two types of metal. The work function of a microelectronic transistor can be varied or "tuned" depending on the precise definition and control of the metal types, layer sequence, individual layer thickness and total number of layers.

23 Claims, 5 Drawing Sheets

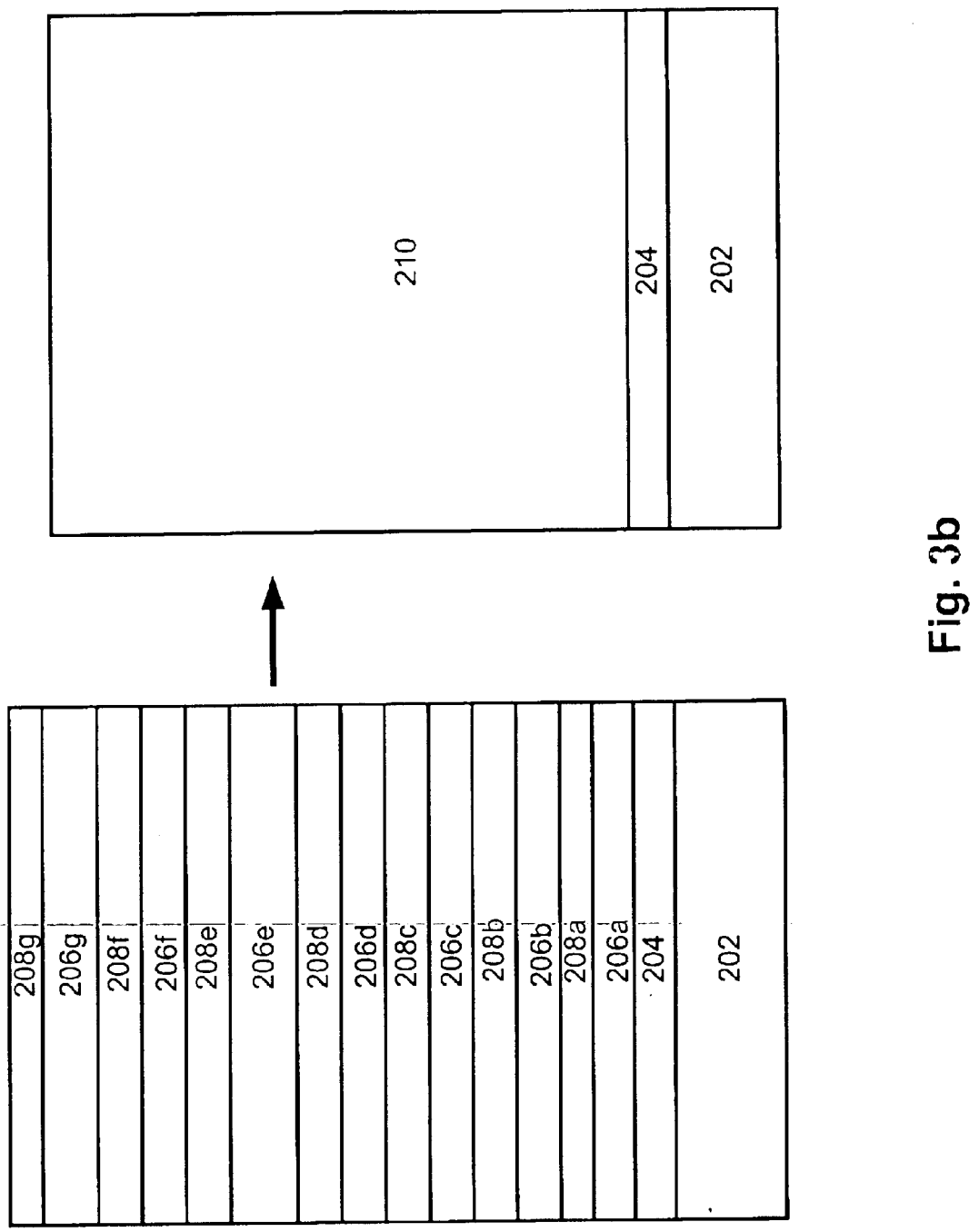

METHODS OF FORMING A MULTILAYER STACK ALLOY FOR WORK FUNCTION ENGINEERING

FIELD OF THE INVENTION

The present invention relates to the field of microelectronic processing, and more particularly to a method of work function tuning by forming a gate electrode utilizing a multi-layer single-phase metal alloying technique.

BACKGROUND OF THE INVENTION

Transistors, as is well known in the art, are the building blocks of all integrated circuits. Modern integrated circuits interconnect literally millions of densely configured transistors that perform a wide variety of functions. To achieve such a dramatic increase in the density of circuit components has required microelectronic manufacturers to scale down the physical dimensions of the transistor below the sub-micron regime. One common type of transistor used in a sub-micron microelectronic device utilizes a polysilicon gate electrode. However, polysilicon gate electrodes may suffer device performance degradation due to the polysilicon depletion effect, wherein an electric field applied to a polysilicon gate sweeps away carriers (holes in a P-type doped polysilicon, or electrons in an N-type doped polysilicon) so as to create a depletion of carriers in the area of the polysilicon gate near the underlying gate dielectric of the transistor. This depletion effect results in a reduction in the strength of the electric field at the surface of the microelectronic when a voltage is applied to the polysilicon gate electrode, which can have an adverse affect on the transistor performance.

One way of improving the performance of sub-micron microelectronic transistors is to use metal gate electrode technology. While replacing traditional polysilicon gate electrodes with metal or metal alloy gate electrodes eliminates the polysilicon depletion effect, there are problems associated with the use of such metal gates. One problem encountered is that the carriers from the metal gate can diffuse into the underlying gate dielectric material, thus causing shorting of the microelectronic device.

Another problem encountered with the use of metal gates is work function mismatch, wherein the work functions of the metal gate p and n-channel transistors do not match the work functions of the p and n channel transistors of the polysilicon gate. It is well-known in the art that in CMOS (complementary metal oxide semiconductor) devices, there are generally two different types of gate electrodes, an n-channel gate electrode and a p-channel gate electrode, which have two different work function values (i.e. an energy level of a semiconductor which can be near the valence or the conduction band of the material). The work function values are about 4.2 and 5.2 electron volts for the n and p-channel electrodes respectively, and they are generally formed by doping the polysilicon to be either n or p type. In contrast, previously proposed metal gate electrodes have focused on using one type of metal for both channels of the gate electrode, with a work function that is located in the middle of the p and n channel work function range (e.g. about 4.7 electron volts). A drawback to this mid-range work function approach is that this type of metal gate device cannot easily achieve a desirable small threshold voltage, which is the amount of voltage that determines the transistor's on and off states, without causing degradation in device performance.

Accordingly, what is needed is a structure and method for obtaining the desired work function values for a metal gate transistor device, which eliminates the problems of polysilicon depletion and that may also eliminate metal diffusion into the gate dielectric layer.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIGS. 3a–3b represent cross-sections of a structure that may be formed when carrying out an embodiment of the method of the present invention.

DETAILED DESCRIPTION OF THE PRESENT INVENTION

Figure 1A:
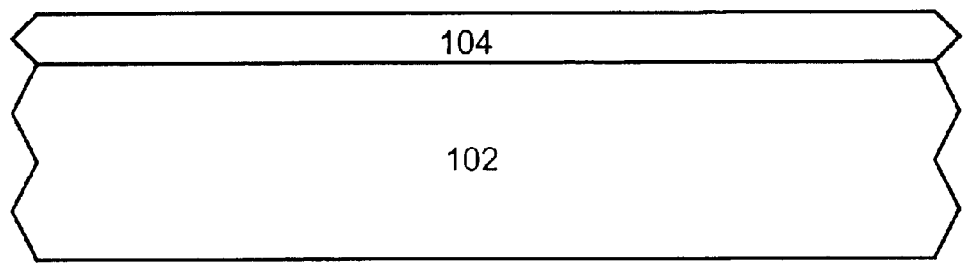
FIGS. 1a–1d represent cross-sections of structures that may be formed when carrying out an embodiment of the method of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

A method for making a microelectronic device is described. That method comprises forming a dielectric layer on a substrate, forming a first metal layer having a first work function on the dielectric layer, forming a second metal layer having a second work function on the first metal layer, such that a gate electrode is formed on the dielectric layer which has a work function that is determined from the work function of the alloy of the two types of metal. The work function is varied or "tuned" depending on the precise definition and control of the metal types, layer sequence, individual layer thickness and total number of layers.

In an embodiment of the method of the present invention, as illustrated by FIGS. 1a–1d, a thin gate dielectric layer 104 is formed on a substrate 102 (FIG. 1a). The substrate 102 may be comprised of materials such as, but not limited to, silicon, silicon-on-insulator, germanium, indium, antimonide, lead telluride, indium arsenide, indium phosphide, gallium arsenide, gallium antimonide, or combinations thereof. Although several examples of materials from which the substrate 102 may be formed are described here, any material that may serve as a foundation upon which a microelectronic device may be built falls within the spirit and scope of the present invention.

In a currently preferred embodiment, the thin gate dielectric layer 104 comprises silicon dioxide. By way of illustration and not limitation, the gate dielectric layer 104 may also include silicon oxide/silicon nitride stacks, nitrided oxides of silicon, or other dielectric materials with electrical properties suitable for use as a MOSFET (metal oxide semiconductor field effect transistor) gate dielectric layer. The gate dielectric layer 104 may further include materials that may be used to make high-k gate dielectrics (i.e. dielectrics having a dielectric constant that is greater than about 8) such as hafnium oxide, zirconium oxide, titanium oxide, and aluminum oxide. Although a few examples of materials that may be used to form the gate dielectric layer 104 are described here, that layer may be made from other materials that serve to reduce gate leakage from the level present in devices that include silicon dioxide gate dielectrics.

The gate dielectric layer 104 may be formed on the substrate 102 using a deposition method known in the art, such as a chemical vapor deposition ("CVD"), a low pressure CVD deposition ("LPCVD"), a physical vapor deposition ("PVD"), or an atomic layer deposition ("ALD") process. Preferably, a CVD process is used. In such a process, a metal oxide precursor (e.g., a metal chloride) and steam may be fed at selected flow rates into a CVD reactor, which is then operated at a selected temperature and pressure to generate an atomically smooth interface between the substrate 102 and the gate dielectric layer 104. The CVD reactor should be operated long enough to form the gate dielectric layer 104 with the desired thickness. In most applications, the gate dielectric layer 104 should be less than about 100 angstroms thick, and more preferably, between about 20 angstroms and about 60 angstroms thick.

Figure 1B:
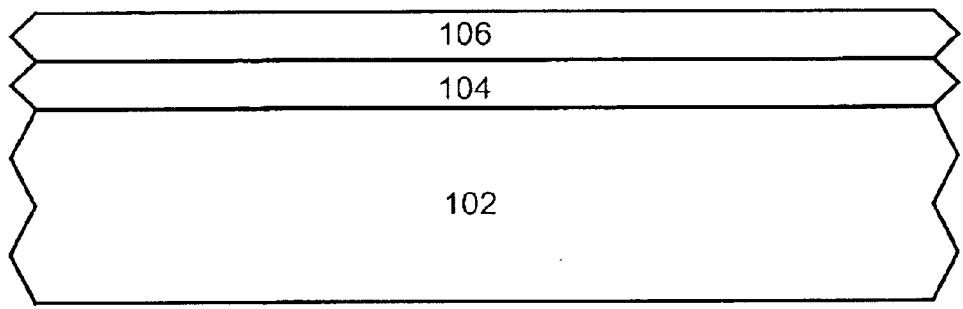
Figure 1C:
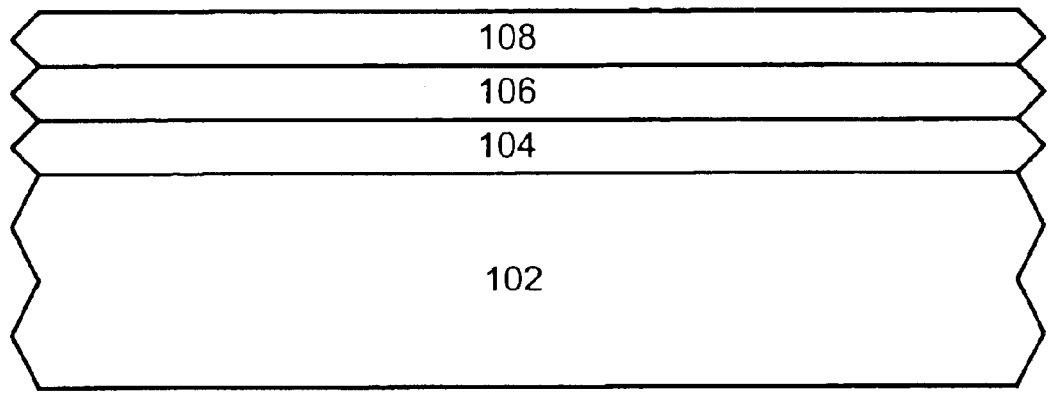
Figure 1D:
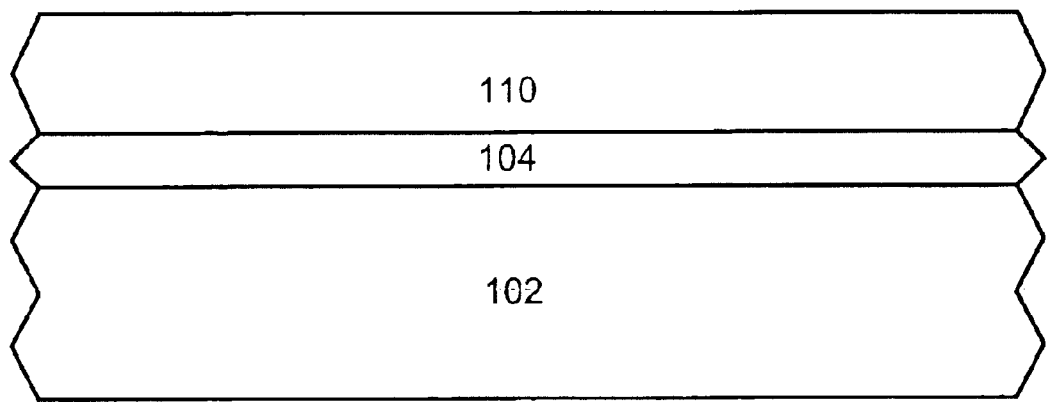

Following the formation of the gate dielectric layer 104, a gate electrode may be formed on the gate dielectric layer 104 (FIGS. 1b–1d). In a preferred embodiment, the gate electrode may be formed by initially depositing a first metal layer having a first work function on the gate dielectric layer 104, and then forming a second metal layer having a second work function on the first metal layer, such that a gate electrode is formed on the dielectric layer which has a work function which is determined from the work function of the alloy of the two types of metal.

The first metal layer 106 may be deposited (FIG. 1b) on the gate dielectric layer 104 using conventional methods known in the art, such as a PVD, ALD, CVD, or a metal organic chemical vapor deposition ("MOCVD") process. The first metal layer 106 can be between about 2.5 to 100 angstroms thick, with 5 to 30 angstroms preferred. The first metal layer 106 may be deposited utilizing a PVD process (preferred), with a process pressure in a range from about 0.1 to 100 millitorr, with 2 to 5 millitorr most preferred, a flow rate of a noble gas, such as argon, in a range between 10 to 200 sccm, with 100 sccm most preferred, and a power between about 100 to 4,000 Watts, with 200 to 300 Watts most preferred.

The material chosen for first metal layer 106 comprises any metal which forms an inter-metallic with another metal, such as but not limited to titanium, aluminum, hafnium, nickel, platinum, cobalt, tantalum, molybdenum, tungsten, zirconium, vanadium, palladium, chromium, metal silicides, metal nitrides, or combinations thereof. Although a few examples of materials that may be used to form the first metal layer 106 are described here, that layer may be made from other materials whose work functions are suitable as either an n-channel or p-channel electrode, or that may be modified or tuned by alloying with another such material that is suitable to form a gate electrode on the gate dielectric layer 104.

A second metal layer 108 is deposited, preferably in the same deposition chamber without breaking the vacuum of the chamber, on the first metal layer 106 (FIG. 1c), and can be between about 2.5 to 100 angstroms thick, with 5 to 30 angstroms preferred. The second metal layer 108 may be deposited using conventional methods known in the art, such as a PVD, ALD, CVD, or a metal organic chemical vapor deposition ("MOCVD") process, the particular parameters of such depositions having been previously described above for the first metal layer 106. The material chosen for the second metal layer 108 comprises any metal which forms an inter-metallic with the first metal layer 106 (such that the first metal layer 106 and the second metal layer 108 comprise different materials from each other), such as but not limited to titanium, aluminum, hafnium, nickel, platinum, cobalt, tantalum, molybdenum, tungsten, zirconium, vanadium, palladium, chromium, metal silicides, metal nitrides, or combinations thereof, as previously described above for first metal layer 106. Although a few examples of materials that may be used to form the second metal layer 108 are described here, that layer may be made from other materials whose work functions are suitable as either an n-channel or p-channel electrodes, or that may be modified or tuned by alloying with the first metal layer 106 to form a gate electrode 110 on the gate dielectric layer 104 (FIG. 1d).

Upon forming the second metal layer 108 on the first metal layer 106, an alloy is generally naturally formed due to the extremely low thickness of the first metal layer 106 and the second metal layer 108. Such an alloy may exhibit exact stoichiometry (the quantitative ratio of each metal in the alloy), which is dictated by the respective thicknesses of the first metal layer 106 and the second metal layer 108. The stoichiometric alloy formation is diffusion length limited, e.g. if the diffusion length of a particular metal layer is about 20 angstroms, the thickness of one layer cannot be greater than the diffusion length of that metal (i.e. 20 angstroms), or else an undesired alloy may form, as is well understood by those skilled in the art. By alternating these extremely thin layers of relatively pure metals, novel single phase alloy structures, or compositions, may be formed which are not possible to form by conventional means, such as by high temperature alloying techniques, or co-deposition of alloys through the use of binary or tertiary PVD targets, for example. Alternatively, it may be desired to expose the gate electrode 110 to subsequent heat treatment processing steps, such as rapid thermal anneal ("RTP") or furnace annealing processing techniques, in order to facilitate formation of a single phase alloy, or composition. Since such techniques are well known in the art, they will not be further described in more detail here.

A further advantage of the present invention is that by using metal alloys instead of pure metal gate electrodes, the covalent bonding that results from the alloying of the first metal layer 106 and second metal layer 108 prevents diffusion of carriers from the gate electrode 110 into the gate dielectric layer 104, therefore preventing shorting of the microelectronic device.

Figure 2:
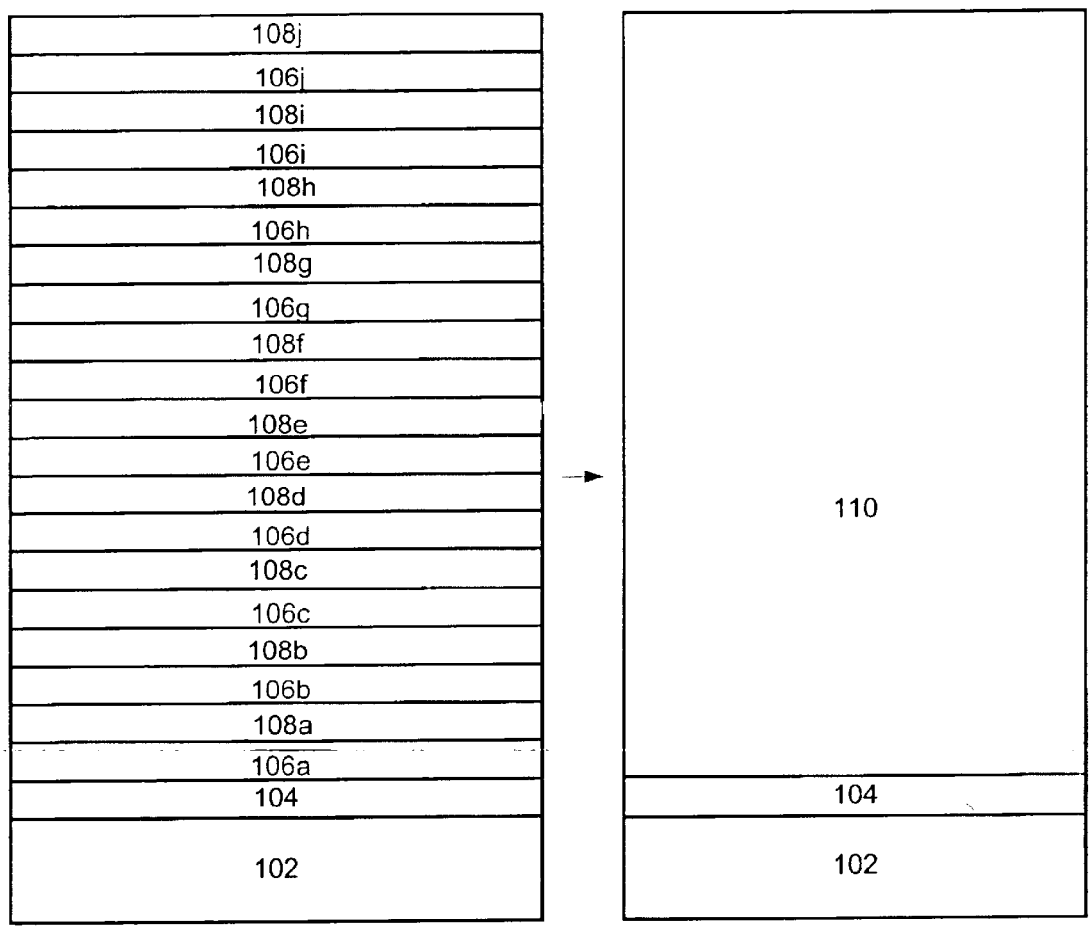
FIG. 2 represents a cross-section of a structure that may be formed when carrying out an embodiment of the method of the present invention.

Thus, the work function of the gate electrode can be tuned or optimized for a desired n-channel or p-channel work function value by continuing to alternate formation of the first metal layer 106 (106a–106j, as shown in FIG. 2), and the second metal layer 108 (108a–108j, as shown in FIG. 2), with the number of alternating layers of each type of metal ranging from 2 to 10, most preferably 10, as shown in FIG. 2. The resultant gate electrode 110 comprises the alloy of the sum of the layers of the first metal layer 106a–106j and the sum of the layers of the second metal layer 108a–108j. The final thickness of the gate electrode 110 ranges from about 50 to 200 angstroms, with 100 angstroms being most preferred. If the final thickness of the layered gate electrode is less than about 50 angstroms, the desired work function value may not be properly achieved, whereas if the thickness of the gate electrode 110 is greater than about 200 angstroms, there may be problems associated with subsequent processing steps such as masking and etching of the gate electrode. It is to be understood that the invention is not limited to a first metal layer and a second metal layer, but can be applied to any such combination of metals which form inter-metallics wherein alternating such metal layers produces a gate electrode with a final thickness in a range of about 50–200 angstroms, such as in the alternating of a first metal layer, a second metal layer, and a third metal layer, for example.

Figure 3A:
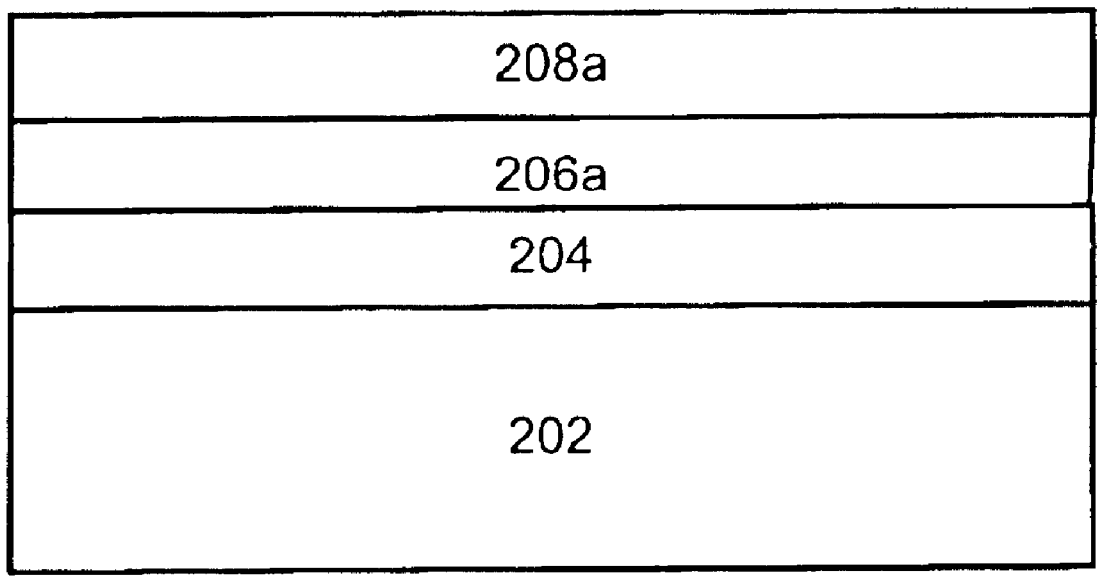

In one particular embodiment of the present invention, a hafnium layer 206a, which has a work function of about 3.9 electron volts, is deposited onto the gate dielectric layer 204 by a PVD deposition process, with an argon pressure between about 2–5 millitorr, a flow rate about 100 sccm of argon, a power of about 200 Watts and is preferably about one atomic layer thick (FIG. 3a). A nickel layer 208a, which has a work function of about 4.5 to 5.3 electron volts, is deposited in the same PVD deposition chamber without breaking vacuum onto the hafnium layer 206a, under the same deposition parameters as described above for the hafnium layer 206a, and is preferably about one atomic layer thick. The hafnium layers 206b–206g are then alternated with the nickel layers 208b–208g to produce a gate electrode 210 that has a final thickness of about 140 angstroms, and comprises 7 layers each of the hafnium layer 206a–206g and the nickel layers 208a–208g (FIG. 3b). The work function of the gate electrode 210 is about between 4.1 and 4.2 electron volts, which generally corresponds to a work function value for an n-channel gate electrode.

As described above, a gate electrode is formed on a dielectric layer that has a work function that is determined from the work function of the alloy of two types of metal. The work function is varied or "tuned" depending on the precise definition and control of the metal types, the layer sequence, the individual layer thickness and total number of layers of the gate electrode 110. By forming a gate electrode 110 on a gate dielectric layer 104, the embodiment described above enables the resulting device to benefit from the presence of the gate electrode layer 110 by eliminating the polysilicon depletion effect and the shorting of the device through the gate dielectric layer by replacing the polysilicon gate material with a covalently bonded metal alloy gate material. The method of the present invention further enables the formation of novel single-phase metal alloy compositions utilizing conventional deposition methods that are not possible to form by conventional alloying techniques. These phases can be either crystalline or amorphous, with the amorphous phases being more preferred.

Although the embodiment described above is an example of a process for forming a metal alloy gate electrode that enables the tuning of the work function of a gate electrode transistor, the present invention is not limited to this particular embodiment, but instead contemplates other processes of forming metal alloy gate electrodes layers to enable the tuning of the work function of the gate electrode transistor.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a gate electrode comprising:
   forming a gate dielectric layer on a substrate; and
   forming a gate electrode on the gate dielectric layer comprising:
      forming a first layer of a first metal having a first work function on the gate dielectric layer;
      forming a first layer of a second metal having a second work function on the first layer of the first metal; and
      forming a second layer of the first metal on the first layer of the second metal and then forming a second layer of the second metal on the second layer of the first metal to form a gate electrode, wherein the work function of the gate electrode is determined by the work functions of the first metal and the second metal.

2. The method of claim 1 wherein the gate electrode comprises a single-phase alloy.

3. The method of claim 2, wherein the total thickness of the gate electrode is about 50 to about 200 angstroms.

4. The method of claim 1, wherein the thickness of the first metal is about 5 to about 30 angstroms.

5. The method of claim 1, wherein the thickness of the second metal is about 5 to about 30 angstroms.

6. The method of claim 1, further comprising alternating forming a layer of the first metal on a layer of the second metal and forming a layer of the second metal on a layer of the first metal, wherein the total number of layers of the first metal is between 3 and about 10.

7. The method of claim 6, wherein the total number of layers of the second metal is between 3 and about 10.

8. The method of claim 1 wherein the first metal is about 10 angstroms thick, and the second metal is about 10 angstroms thick.

9. The method of claim 1 wherein the gate electrode is annealed.

10. The method of claim 1 wherein the first metal substantially comprises hafnium, and the second metal substantially comprises nickel.

11. The method of claim 1 wherein the first and second metal are formed by physical vapor deposition.

12. The method of claim 1 wherein at least one of the first metal and the second metal substantially comprises a material selected from the group consisting of titanium, aluminum, hafnium, nickel, platinum, cobalt, tantalum, molybdenum, tungsten, zirconium, vanadium, palladium, chromium, metal silicides, metal nitrides, or combinations thereof.

13. The method of claim 1, wherein the gate electrode is amorphous.

14. The metal alloy of claim 1, wherein the gate electrode has a work function of about 3.9 to about 5.3 eV.

15. A method of forming a metal alloy comprising:
   forming a first layer of a first metal with a first work function on a substrate;

forming a first layer of a second metal with a second work function on the first metal; and forming a second layer of the first metal on the first layer of the second metal and then forming a second layer of the second metal on the second layer of the first metal to form a single phase metal alloy, wherein the work function of the single phase metal alloy is determined by the work functions of the first metal and the second metal.

16. The method of claim 15, wherein the thickness of the first metal is about 5 to about 30 angstroms.

17. The method of claim 16, wherein the thickness of the second metal is about 5 to about 30 angstroms.

18. The method of claim 15, wherein the total thickness of the metal alloy is about 50 to about 200 angstroms.

19. The method of claim 15, further comprising alternating forming a layer of the first metal on a layer of the second metal wherein the total number of layers of the first metal is between 2 and about 10.

20. The method of claim 19, wherein the total number of layers of the second metal is between 2 and about 10.

21. The method of claim 15 wherein at least one of the first metal and the second metal substantially comprises a material selected from the group consisting of titanium, aluminum, hafnium, nickel, platinum, cobalt, tantalum, molybdenum, tungsten, zirconium, vanadium, palladium, chromium, metal silicides, metal nitrides, or combinations thereof.

22. The method of claim 15, wherein the metal alloy is annealed.

23. The method of claim 15, wherein the metal alloy is amorphous.

* * * * *